(12) United States Patent
Gaide

(10) Patent No.: US 12,154,617 B2
(45) Date of Patent: Nov. 26, 2024

(54) YIELD RECOVERY SCHEME FOR MEMORY

(71) Applicant: XILINX, INC., San Jose, CA (US)

(72) Inventor: Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 174 days.

(21) Appl. No.: 17/950,022

(22) Filed: Sep. 21, 2022

(65) Prior Publication Data

US 2024/0096405 A1 Mar. 21, 2024

(51) Int. Cl.
*G11C 11/4094* (2006.01)
*G11C 11/408* (2006.01)
*G11C 11/4093* (2006.01)

(52) U.S. Cl.
CPC ...... *G11C 11/4094* (2013.01); *G11C 11/4085* (2013.01); *G11C 11/4093* (2013.01)

(58) Field of Classification Search
CPC ............ G11C 11/4094; G11C 11/4085; G11C 11/4093
See application file for complete search history.

(56) References Cited

U.S. PATENT DOCUMENTS

| | | | | |
|---|---|---|---|---|
| 7,187,597 B1* | 3/2007 | Trimberger | .......... | G11C 29/816 365/189.12 |
| 7,233,169 B1* | 6/2007 | Vadi | .................. | H03K 19/17736 365/189.05 |
| 7,746,107 B1* | 6/2010 | Singh | ............... | H03K 19/17764 326/38 |
| 8,516,339 B1* | 8/2013 | Lesea | ................ | H03M 13/2906 714/763 |

* cited by examiner

*Primary Examiner* — Ajay Ojha
(74) *Attorney, Agent, or Firm* — Patterson + Sheridan, LLP

(57) ABSTRACT

A yield recovery scheme for configuration memory of an IC device includes asserting an override configuration value on a bitline of memory cells of the configuration memory, where a data node of a faulty one of the memory cells is coupled to a node of configurable circuitry of the IC device, and asserting a wordline of the faulty memory cell while the override configuration value is asserted on the bitline to couple the bitline to the node of the configurable circuitry through the faulty memory cell (i.e., to force a state of the data node to the override configuration value). An identifier of the faulty memory cell may be stored on the IC device (e.g., E-fuses), and control circuitry of the IC device may retrieve the identifier to configure override circuitry of the IC device.

20 Claims, 6 Drawing Sheets

YIELD RECOVERY SCHEME FOR MEMORY

TECHNICAL FIELD

Examples of the present disclosure generally relates to yield recovery schemes for memory.

BACKGROUND

An integrated circuit (IC) device, such as a field programmable gate array (FPGA), may include configuration memory to store configuration bits or values for configuring programmable circuitry, such as interconnect and/or functional circuitry. During normal operation, all configuration bits are read or asserted simultaneously and continuously to maintain a desired configuration. Configuration memory may include random access memory (RAM), which may be referred to herein as configuration RAM or CRAM.

Yield fallout due to configuration bit failures (i.e., failures of memory cells of the configuration memory) is relatively high, sometimes accounting for 30-40% of all failures.

Conventional memory yield recovery schemes are designed for situations where only one word is accessible at a time. Conventional memory yield recovery schemes are thus not suitable for configuration memory. For example, a column redundancy scheme would need to configurably intercept the output of every configuration memory cell, which would be prohibitively expensive.

SUMMARY

Yield recovery schemes for configuration memory are described. One example is an integrated circuit (IC) device that includes configurable circuitry, configuration memory that includes multiple memory cells configured to store respective configuration values, where a data node of a first one of the memory cells is coupled to a node of the configurable circuitry, override circuitry coupled to a bitline of the memory cells, and control circuitry to configure the override circuitry to assert an override configuration value onto the bitline, wherein the control circuitry is further configured to assert a wordline of the first memory cell while the override circuitry asserts the override configuration value onto the bitline.

Another example described herein is method that includes asserting an override configuration value on a bitline of memory cells of a configuration memory of an integrated circuit (IC) device, where a data node of a first one of the memory cells is coupled to a node of configurable circuitry of the IC device, and asserting a wordline of the first memory cell while the override configuration value is asserted on the bitline.

Another example described herein is a system that includes an integrated circuit (IC) evaluation device configured to evaluate configuration memory of an IC device to identify a first one of multiple memory cells of the configuration memory as faulty, determine that the faulty memory cell can be overridden, and store an identifier of the faulty memory cell in non-volatile storage circuitry of the IC device.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
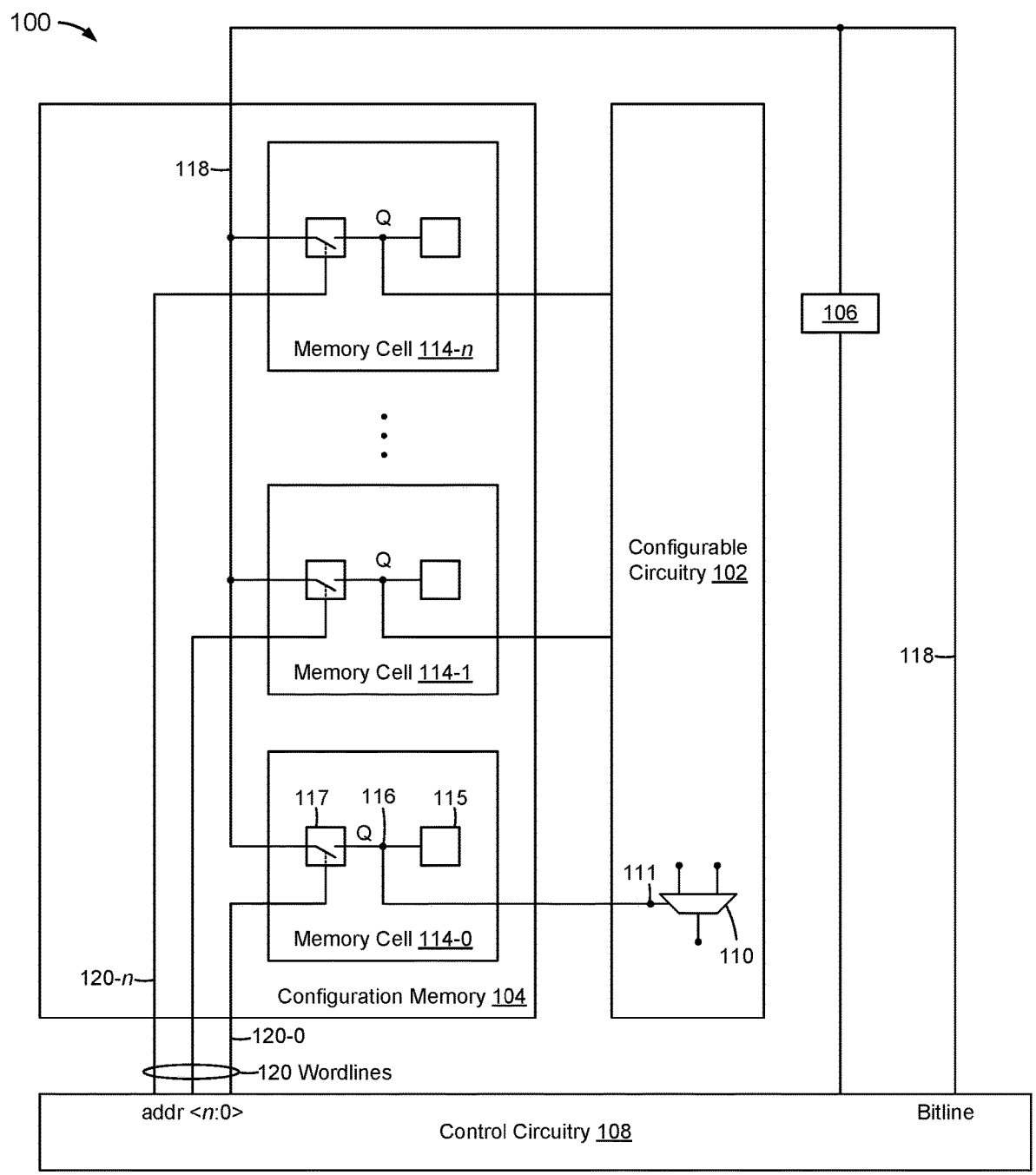
FIG. 1 is a block diagram of an integrated circuit (IC) device that includes configurable circuitry, configuration memory, and override circuitry, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe yield recovery schemes for memory. Embodiments herein may be useful to recover from read-back failures in configuration memory that is used to configure circuitry of an integrated circuit (IC) device.

Embodiments herein leverage existing configuration read/write circuitry by adding a relatively small number of redundant memory cells to provide redundancy for multiple (e.g., hundreds or thousands) of existing memory cells. The cost of the yield recovery scheme is relatively low. It is estimated that ⅓ or more of all CRAM test fallout is due read-back failures. Recovering even a fraction of faulty memory cells would be useful.

Embodiments herein may be useful to recover from memory cell faults that are due to weak or failing cross-coupled inverters, stuck-at faults in which a state of a memory cell cannot be overwritten, open connections (e.g., unconnected contact or via, open metal line, and/or other reason). Embodiments herein are not, however, limited to memory cell faults that are due to the foregoing examples.

FIG. 1 is a block diagram of an integrated circuit (IC) device 100 that includes configurable circuitry 102, configuration memory 104, and override circuitry 106, according to an embodiment. IC device 100 may represent, without limitation, an IC die, chip, family of dies or chips, an accelerator circuit, a system-on-a-chip, or a network interface controller.

Configurable circuitry 102 may include functional circuitry and/or interconnection circuitry. Interconnection circuitry may provide configurable connections within a functional circuit block and/or amongst multiple functional circuit blocks.

Configuration memory 104 includes multiple memory cells, illustrated here as memory cells 114-0 through 114-$n$ (collectively referred to as memory cells 114). Memory cell 114-0 includes a storage device 115 that stores a configuration bit or value for a respective node or feature of configurable circuitry 102. Memory cell 114-0 further includes an access device 117 that couples a bitline 118 to a data node 116 of memory cell 114-0 when a wordline 120-0, is asserted. Remaining memory cells 114-1 through 114-$n$ may be configured similar to memory cell 114-0.

The configuration value stored in memory cell 114-0 may be continuously available or asserted at a data node 116 of memory cell 114-0. In the example of FIG. 1, configurable circuitry 102 includes a multiplexer 110 that outputs one of multiple inputs based on a control asserted at a node 112 of interconnection circuitry 102. In this example, the control is provided by data node 116 of memory cell 114-0 data node 116 of memory cell 114-0.

In the example of FIG. 1, a state of memory cell 114-0 (i.e., the configuration bit or value stored in memory cell 114-0) is asserted at node 111 without performing a read operation (i.e., without asserting a wordline of memory cell 114-0).

Override circuitry 106 provides or asserts a configuration override bit or value to configurable circuitry 102 through a selectable one of memory cells 114. Override circuitry 106 may be useful to compensate for a faulty memory cell within configuration memory 104. Override circuitry 106 may include volatile storage circuitry such as a volatile memory cell, buffer, or register to store the configuration override value. The volatile storage circuitry may include a memory cell that is substantially similar to memory cells 114. In an embodiment, the volatile storage circuitry may include driver circuitry sufficient to overcome a stuck-at fault of a memory cell 114.

IC device 100 may further include control circuitry 108, which may include memory controller circuitry. Control circuitry 108 writes configuration values to memory cells 114 through bitline 118, and configures override circuitry 106 with the configuration override value.

In the example of FIG. 1, bitline 118 is shared amongst memory cells 114-0 through 114-$n$, and memory cells 114-0 through 114-$n$ are individually addressable through respective wordlines 120-0 through 120-$n$. Control circuitry 108 may also configure override circuitry 106 with the predetermined value.

Memory cells 114 may include volatile memory cells, such as random access memory (RAM), which may be referred to herein a configuration RAM or CRAM. Memory cells 114 may include static RAM or SRAM cells. Memory cells 114 may include cross-coupled inverters, such as described below with reference to FIG. 2 or FIG. 3.

Figure 2:
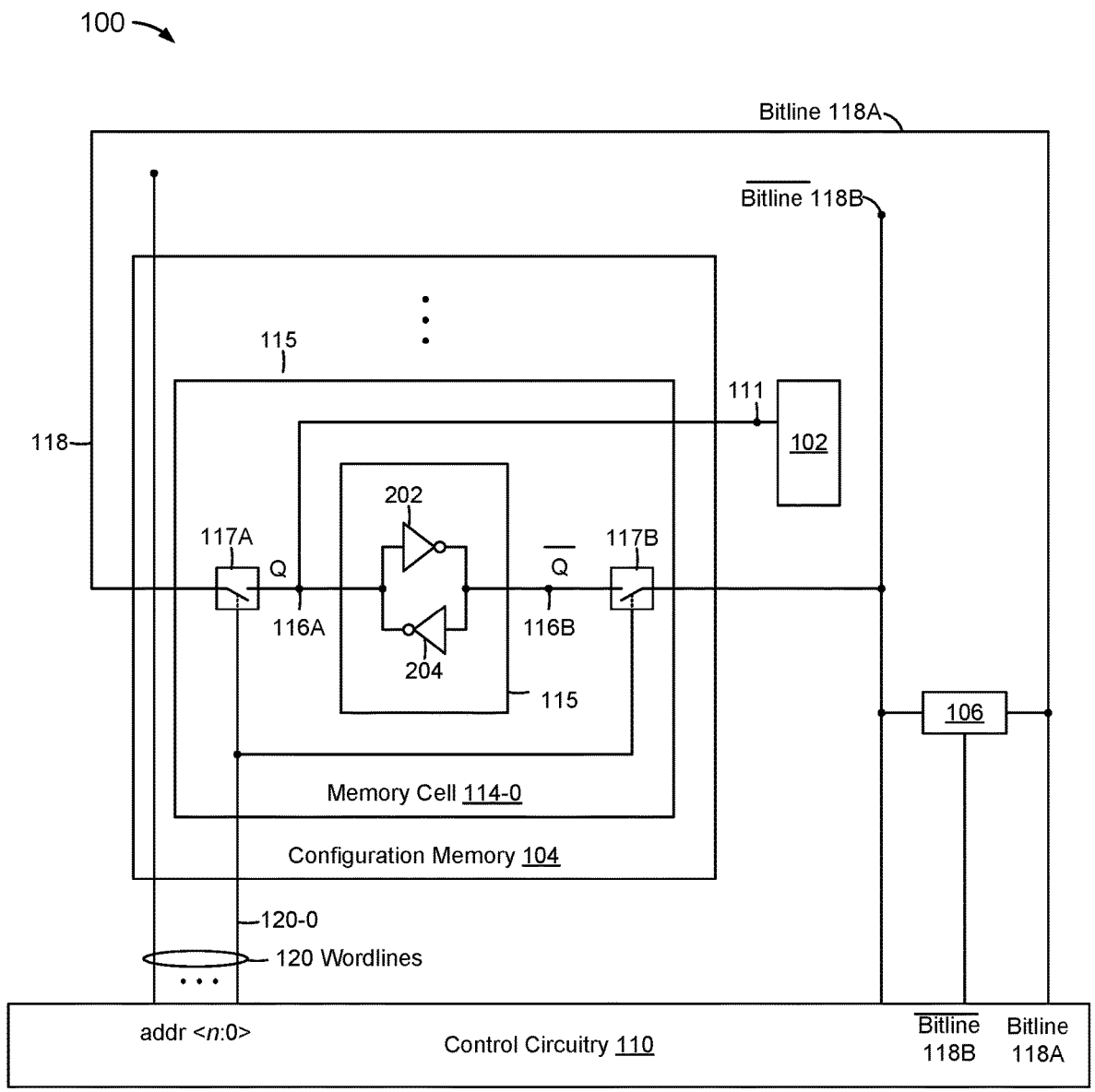
FIG. 2 is a block diagram of the IC device in which a memory cell includes cross-coupled inverters and access devices, according to an embodiment.

FIG. 2 is a block diagram of IC device 100 in which memory cell 114-0 includes cross-coupled inverters 202 and 204, and access devices 117A and 117B, according to an embodiment. When control circuitry 108 asserts wordline 120-0 and asserts opposing or complimentary states on a bitline 118A and a complementary bitline 118B (i.e., bitline 118B), the complimentary states are applied to data nodes 116A and 116E through respective access devices 117A and 117B. Cross-coupled inverters 202 and 204 maintain the complementary states at data nodes 116A and 116B when wordline 120-0 is de-asserted.

Figure 3:
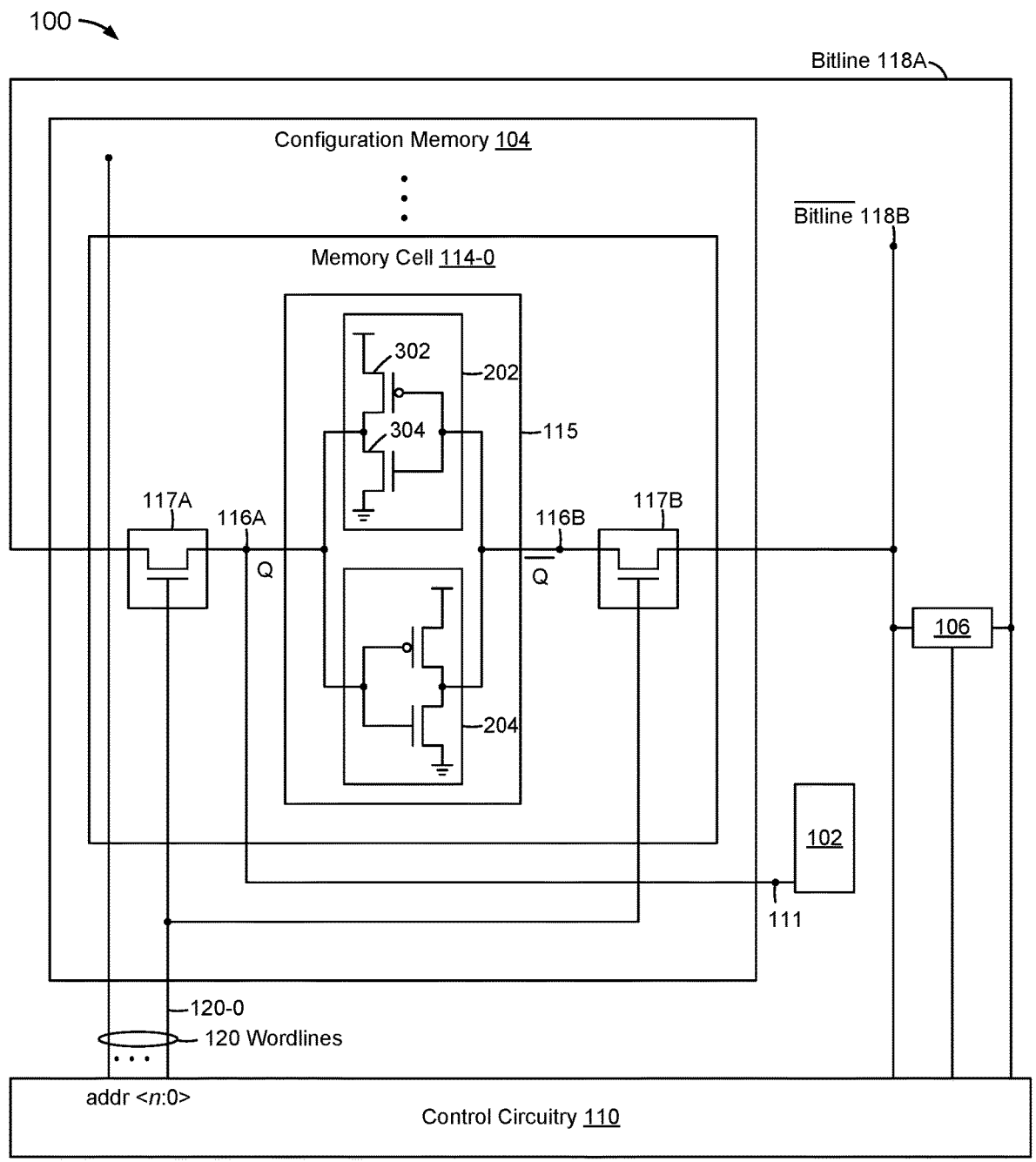
FIG. 3 is a block diagram of the IC device in which the cross-coupled inverters include N-type and P-type devices, and the access devices 117A and 117B include N-type devices, according to an embodiment.

FIG. 3 is a block diagram of IC device 100 in which cross-coupled inverters 202 and 204 include N-type and P-type devices, and access devices 117A and 117B include respective N-type devices, according to an embodiment. Using inverter 202 as an example, when data node 116B is high, p-type device 302 turns off and N-type device 304 turns on, which couples data node 116A to ground. Conversely, when data node 116B is low, N-type device 304 turns off and p-type device 302 turns on, which couples data node 116A to a supply voltage (i.e., high).

Figure 4:
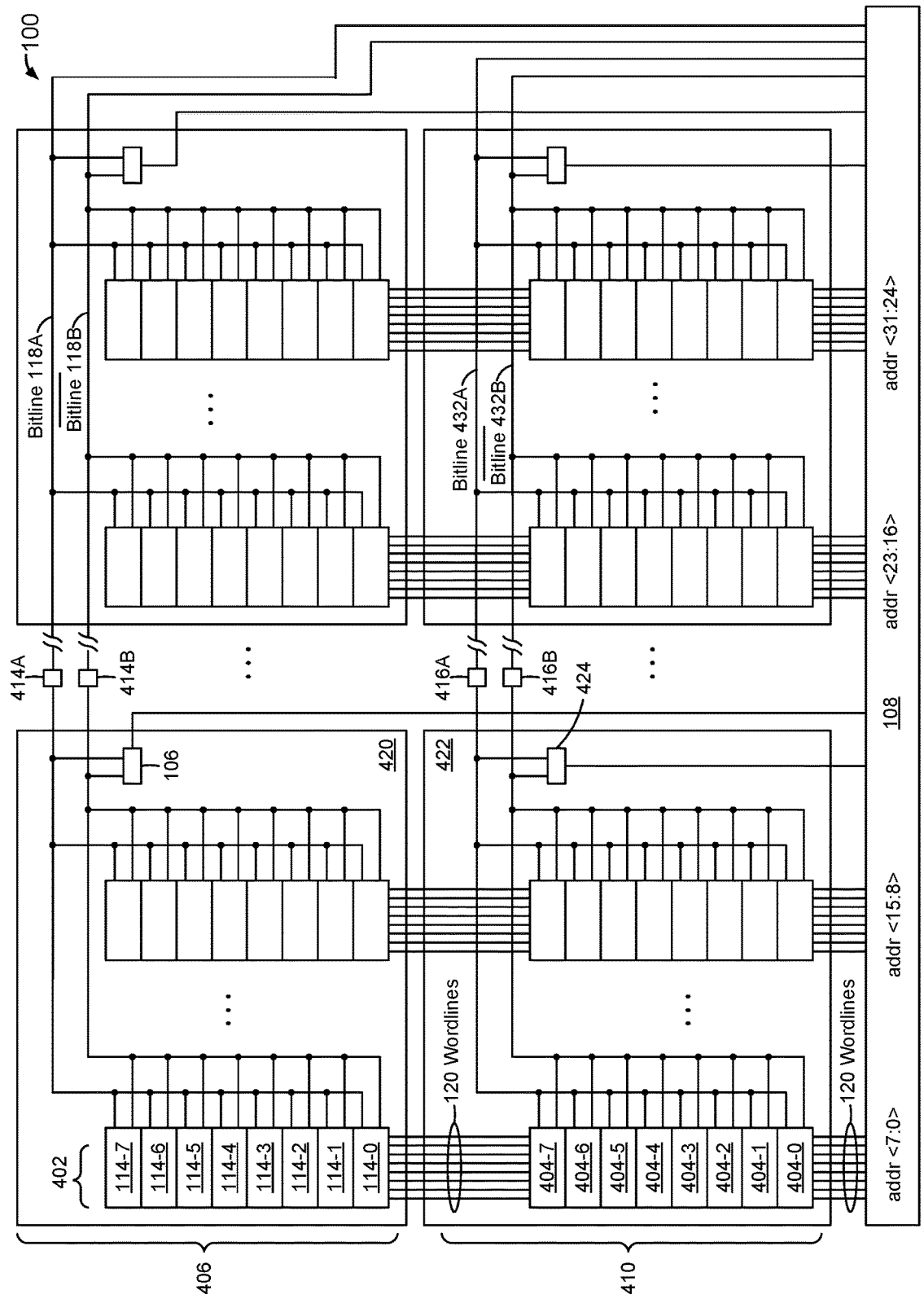
FIG. 4 is a block diagram of the IC device in which the configuration memory is arranged in rows, columns, and blocks.

FIG. 4 is a block diagram of IC device 100 in which configuration memory is arranged in rows, columns, and blocks. A column 402 includes 16 memory cells, 114-0 through 114-7 and 404-0 through 404-7.

In the example of FIG. 4, control circuitry 108 utilizes 8 wordlines <7:0> to address or access the 16 memory cells of column 402. In other words, each of wordlines <7:0> accesses one of memory cells 114-0 through 114-7 and one of memory cells 104-1 through 104-7.

Further in the example of FIG. 4, IC device 100 includes bitline 118 and complementary bitline 118B for a first row 406 of memory cells, and a bitline 432A and a complementary bitline 432B for a row 410 of memory cells. Bitlines 118A, 118B, 432A, and 432B include respective buffers or repeaters 414A, 414B, 416A, and 416B. The repeaters essentially define blocks of memory cells within respective rows 406 and 410 that may be provided with respective override circuitry. In FIG. 4, for example, a block 420 includes override circuitry 106 to accommodate a faulty memory cell within block 420. A block 422 includes override circuitry 424 to accommodate a faulty memory cell within block 422. When override circuitry 106 is utilized, buffers or repeaters 414A and 414B may be disabled to create open circuits. Similarly, when override circuitry 424 is utilized, buffers or repeaters 416A and 416B may be disabled to create open circuits.

Block 420 may include tens, hundreds, or thousands of memory cells. Override circuitry 106 can override any one of the memory cells within block 420.

In FIG. 4, columns of memory cells (e.g., column 402) may be distributed throughout and/or amongst configurable circuitry 102 (FIG. 1), such that a column of memory cells (e.g., column 402) is physically proximate to respective nodes or features of configurable circuitry 102.

In an embodiment, override circuitry (e.g., 106 and 424 in FIG. 4), is implemented as redundant columns of CRAM cells, which may be distributed throughout IC device 100.

Figure 5:
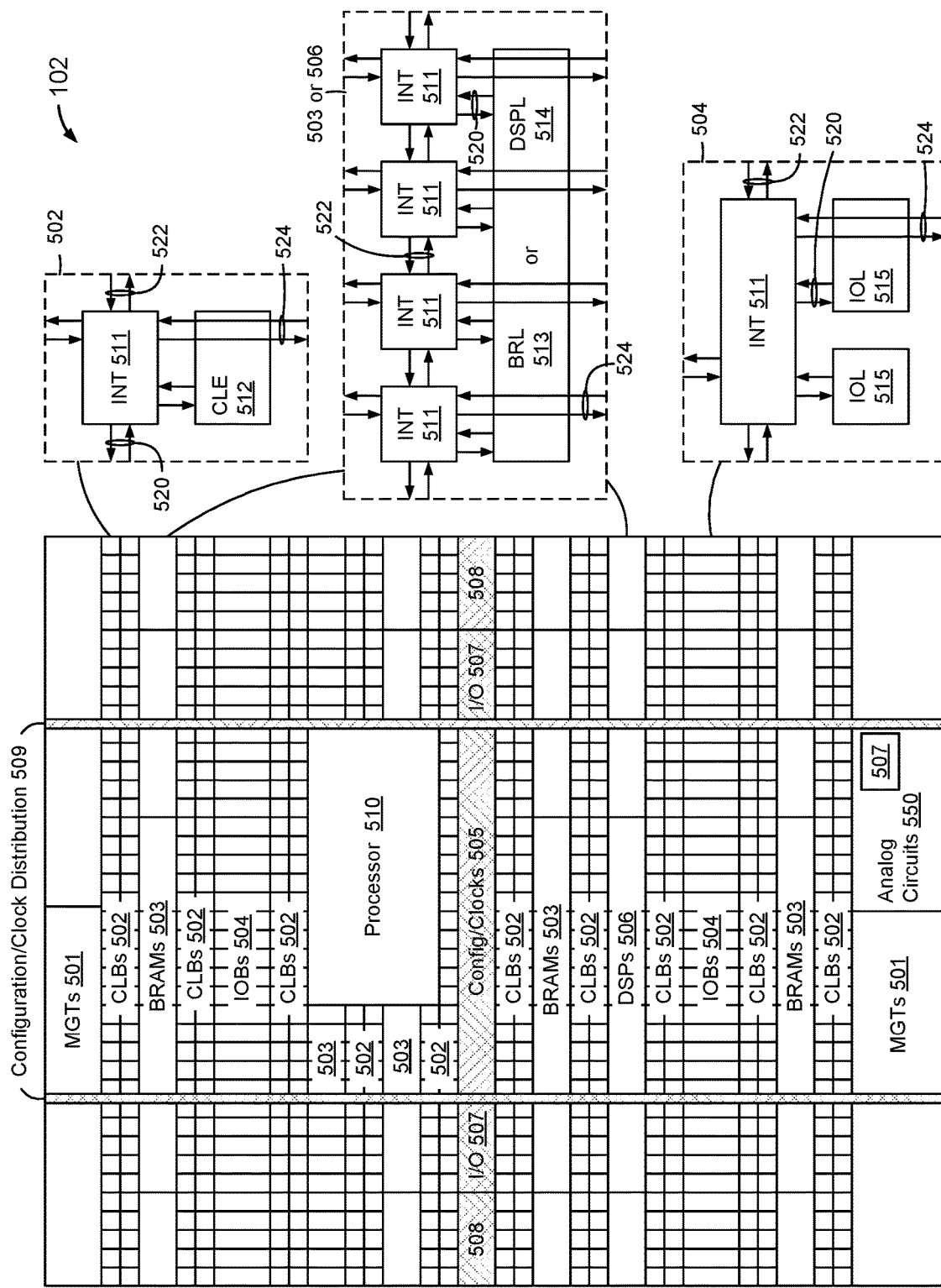
FIG. 5 is a block diagram of the configurable circuitry, including an array of configurable or programmable circuit blocks or tiles, according to an embodiment.

Configurable circuitry 102 may include an array of multiple types of configurable circuit blocks, such as described below with reference to FIG. 5. FIG. 5 is a block diagram of configurable circuitry 102, including an array of configurable or programmable circuit blocks or tiles, according to an embodiment. The example of FIG. 5 may represent a field programmable gate array (FPGA) and/or other IC devices that utilize configurable interconnect structures for selectively coupling circuitry/logic elements, such as complex programmable logic devices (CPLDs).

Configuration memory 104 of FIG. 1 may be distributed throughout and/or amongst configurable features of FIG. 5.

Configuration memory 104 and other features of FIG. 1 are omitted from FIG. 5 for illustrative purposes.

In the example of FIG. 5, the tiles include multi-gigabit transceivers (MGTs) 501, configurable logic blocks (CLBs) 502, block random access memory (BRAM) 503, input/output blocks (106s) 504, configuration and clocking logic (Config/Clocks) 505, digital signal processing (DSP) blocks 506, specialized input/output blocks (I/O) 507 (e.g., configuration ports and clock ports), and other programmable logic 508, which may include, without limitation, digital clock managers, analog-to-digital converters, and/or system monitoring logic. The tiles further includes a dedicated processor 510.

One or more tiles may include a programmable interconnect element (INT) 511 having connections to input and output terminals 520 of a programmable logic element within the same tile and/or to one or more other tiles. A programmable INT 511 may include connections to interconnect segments 522 of another programmable INT 511 in the same tile and/or another tile(s). A programmable INT 511 may include connections to interconnect segments 524 of general routing resources between logic blocks (not shown). The general routing resources may include routing channels between logic blocks (not shown) including tracks of interconnect segments (e.g., interconnect segments 524) and switch blocks (not shown) for connecting interconnect segments. Interconnect segments of general routing resources (e.g., interconnect segments 524) may span one or more logic blocks. Programmable INTs 511, in combination with general routing resources, may represent a programmable interconnect structure.

A CLB 502 may include a configurable logic element (CLE) 512 that can be programmed to implement user logic. A CLB 502 may also include a programmable INT 511.

A BRAM 503 may include a BRAM logic element (BRL) 513 and one or more programmable INTs 511. A number of interconnect elements included in a tile may depends on a height of the tile. A BRAM 503 may, for example, have a height of five CLBs 502. Other numbers (e.g., four) may also be used.

A DSP block 506 may include a DSP logic element (DSPL) 514 in addition to one or more programmable INTs 511. An 10B 504 may include, for example, two instances of an input/output logic element (IOL) 515 in addition to one or more instances of a programmable INT 511. An I/O pad connected to, for example, an I/O logic element 515, is not necessarily confined to an area of the I/O logic element 515.

In the example of FIG. 5, configIclocks 505 may be used for configuration, clock, and/or other control logic. Vertical columns 509 may be used to distribute clocks and/or configuration signals.

A logic block (e.g., programmable of fixed-function) may disrupt a columnar structure of configurable circuitry 102. For example, processor 510 spans several columns of CLBs 502 and BRAMs 503. Processor 510 may include one or more of a range of components such as, without limitation, a single microprocessor to a complete programmable processing system of microprocessor(s), memory controllers, and/or peripherals.

In FIG. 5, configurable circuitry 102 further includes analog circuits 550, which may include, without limitation, one or more analog switches 107, multiplexers, and/or de-multiplexers. Analog switches 107 may be useful to reduce leakage current.

FIG. 5 is provided for illustrative purposes. Configurable circuitry 102 is not limited to numbers of logic blocks in a row, relative widths of the rows, numbers and orderings of rows, types of logic blocks included in the rows, relative sizes of the logic blocks, illustrated interconnect/logic implementations, or other example features of FIG. 5.

Figure 6:
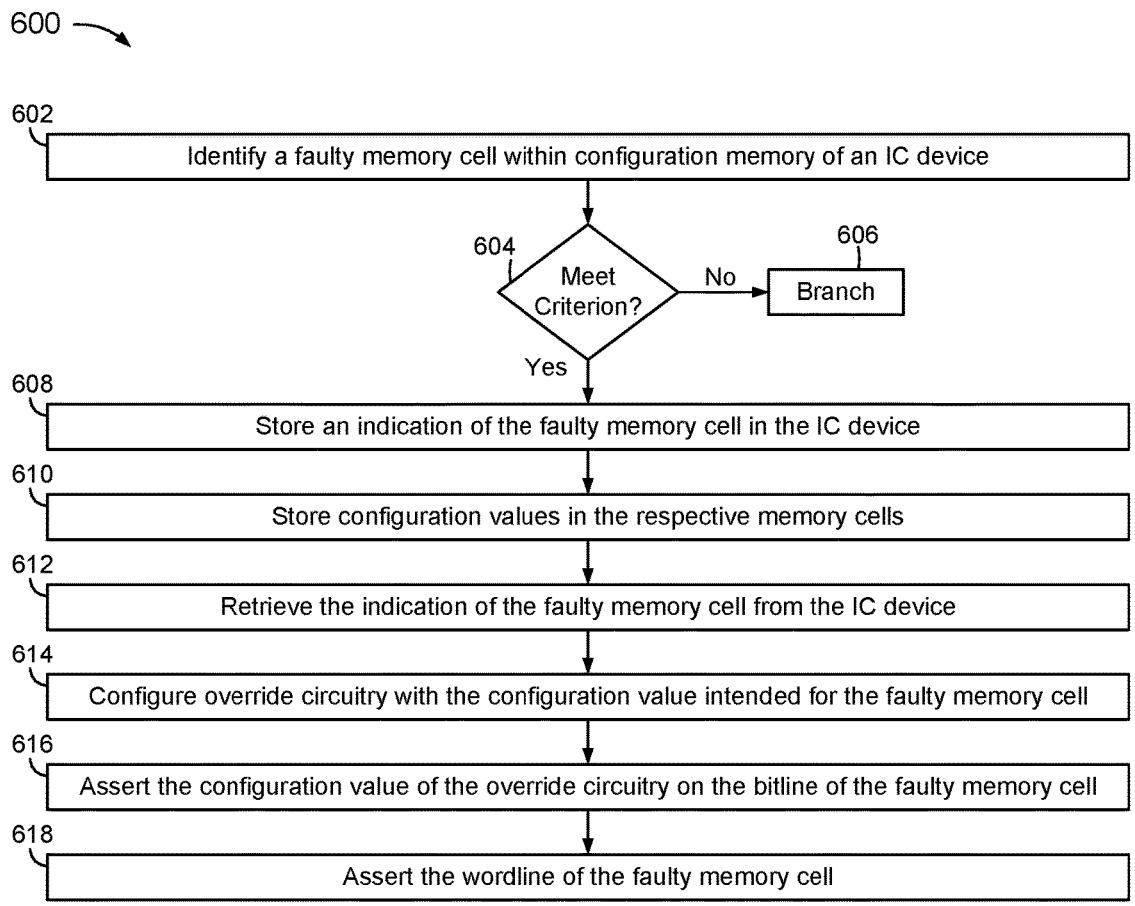
FIG. 6 is a flowchart of a method of accommodating a faulty memory cell within configuration memory, according to an embodiment.

FIG. 6 is a flowchart of a method 600 of accommodating a faulty memory cell within configuration memory, according to an embodiment. Method 600 is described below with reference to IC device 100. Method 600 is not, however, limited to the example of IC device 100.

At 602, a testing/evaluation system identifies a faulty memory cell (e.g., memory cell 114-0) of configuration memory 104. The testing/evaluation system may identify the faulty memory cell during a post-manufacture test/evaluation procedure (e.g., at wafer sort) and/or at a later time. The testing/evaluation system may identify the faulty memory cell based on a read-back test. In a read-back test, the testing/evaluation system may write test data to memory cells 114, read contents of memory cells 114, and compare the contents read from memory cells 114 to the test data.

At 604, the testing/evaluation system determines whether the fault is a type that can be accommodated with override circuitry 106. The testing/evaluation system may determine whether the faulty memory cell meets a criterion or a set of criteria. The criterion/criteria may be indicative, for example, of whether the fault is due to weak or failing cross-coupled inverters, a faulty access device (e.g., access device 117, 117A, and/or 117B), whether the faulty memory cell contains a short/open (e.g., whether data nodes 116A and 116B are shorted through inverter 202 and/or inverter 204), and/or whether there is more than one faulty memory cell within a block of memory cells (e.g., within block 420).

In an embodiment, the testing/evaluation system determines whether the fault is a type that can be accommodated with override circuitry 106 by driving bitline 118 with a test bit or value while asserting wordline 120-0 of memory cell 114-0, and determining whether the test bit appears at node 111 of configurable circuitry 102. This may be useful to identify memory cell faults that are due to weak or failing cross-coupled inverters and/or stuck-at faults, which may be remedied with override circuitry 106.

At 606, if the faulty memory cell does not meet the criterion/criteria, the testing system may report the fault and/or take other remedial measure(s).

At 608, if the faulty memory cell meets the criterion/criteria, the testing testing/evaluation system deems the faulty memory cell repairable, and stores an indication of the faulty memory cell in persistent or non-volatile storage circuitry of IC device 100 (e.g., E-fuses). The indication may include an identifier of a wordline and/or a bitline of the faulty memory cell (e.g., wordline 120-0 and bitline 118).

At 610, control circuitry 108 writes configuration values to configuration memory 104. Control circuitry 108 may write the configuration values from a configuration file, which may be stored in a Flash device. In FIG. 4, control circuitry 108 may write configuration values to memory cells within row 406 by sequentially asserting the configuration values and their complimentary values on bitlines 118A and 118B while sequentially asserting wordlines of the respective memory cells.

At 612, control circuitry 108 retrieves the indication of faulty memory cell 114-0 that was stored at 608. Control circuitry 108 may retrieve the indication of faulty memory cell 114-0 from non-volatile storage circuitry of IC device 100.

At 614, control circuitry 108 configures override circuitry 106 with the configuration value intended for faulty memory cell 114-0. Control circuitry 108 may determine the configuration value intended for faulty memory cell 114-0 from the source from which control circuitry 108 obtained the configuration values at 910.

At 616, override circuitry 106 asserts the configuration value intended for faulty memory cell 114-0 on bitline 118. Override circuitry 106 may assert the configuration value and its compliment on bitlines 118A and 118S. In an embodiment, control circuitry 108 controls override circuitry 106 to assert the configuration value, such as with a control signal or a read operation. In another embodiment, override circuitry 106 asserts the configuration value on bitline 118 or bitlines 118A and 118B without further prompt or control from control circuitry 108. In FIG. 4, control circuitry 108 may disable or open repeaters 414A and 414B.

At 618, control circuitry 108 asserts wordline 120-0 of faulty memory cell 114-0 to couple bitline 118 to data node 116 of faulty memory cell 114-0, and thus to node 111 of configurable circuitry 102. Control circuitry 108 may de-assert wordlines of other memory cells.

Features described above with respect to 606, 604, and 608, may correspond to a test/evaluation phase of IC device 100. Features described above with respect to 610, 612, and 614 may correspond to a configuration phase of IC device 100. Features described above with respect to 616 and 618 may correspond to an operational phase of IC device 100. In other words, a faulty memory cell is detected and recorded at test time. Then, in the field, IC device 100 loads a normal bit stream (i.e., writes configuration bits to memory cells 114), retrieve the faulty memory cell information, and configures override circuitry 106.

Alternatively, or additionally, IC device 100 includes a built-in self-test (MST) that evaluates configuration memory 104 off-line or in the field. The GIST may, for example, evaluate configuration memory 104 every time IC device 100 is initialized or powered up, if a faulty memory cell is detected during the GIST, control circuitry may configure override circuitry 106 as described in one or more examples herein.

In FIG. 4, when override circuitry 106 asserts an override value on a segment of bitline 118 within block 420 (e.g., to override memory cell 114-0), it may not be possible to read memory cells within block 420. Normally, this is not an issue for configuration memory. There may, however, be times when it would be useful to read memory cells during operation of IC device 100, such as for single event upset (SEU) scanning or flop state capture. In an embodiment, a budget is set to limit the number of memory cells that may be overridden. For example, where configuration memory 104 includes >500 M memory cells segmented into blocks of approximately 76K memory cells, overriding a memory cell in one block (e.g., memory cell 114-0 in block 420), precludes reading of only approximately ⅕₀₀₀ of the total number of memory cells. For SEU scanning, the chip-level impact of several repairs may relatively insignificant or tolerable. For flop state capture, where relatively few memory cells contain flop state data, yield recovery schemes disclosed herein may be applied to memory cells that do not contain flop state data.

In an embodiment, override circuitry (e.g., 106 and 424 in FIG. 4) is implemented as redundant columns of CRAM cells distributed throughout IC device 100.

Figure 7:
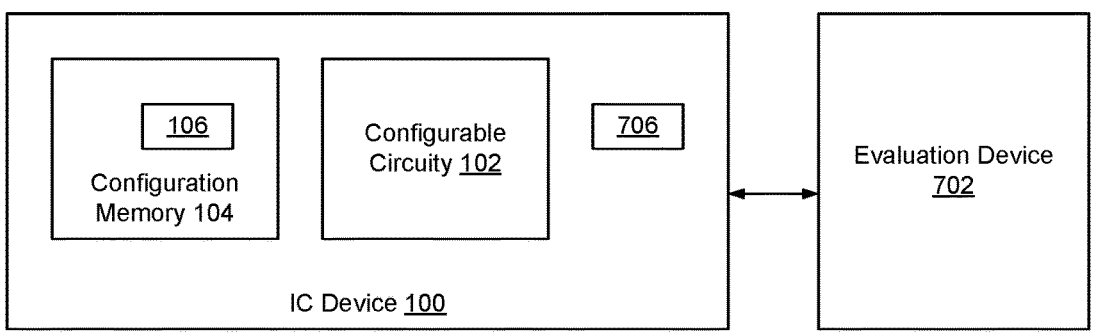
FIG. 7 is a block diagram of an IC evaluation device that evaluates the IC device, according to an embodiment.

FIG. 7 is a block diagram of an IC evaluation device 702 that evaluates IC device 100, according to an embodiment. IC evaluation device 702 evaluates configuration memory 1N to identify a memory cell, determines whether the faulty memory cell can be successfully overridden by override circuitry 106, and stores an identifier of the faulty memory cell in non-volatile storage circuitry 706 of IC device 100. IC evaluation device 702 may include integrated circuitry and/or a processor and memory configured with instructions to perform the foregoing tasks.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product.

Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit (IC) device, comprising:
configurable circuitry;
configuration memory that includes multiple memory cells configured to store configuration bits for the configurable circuitry, wherein a data node of a first one of the memory cells is coupled to a node of the configurable circuitry;
override circuitry coupled to a bitline of the memory cells; and
control circuitry to configure the override circuitry to assert an override configuration value onto the bitline, wherein the control circuitry is further configured to assert a wordline of the first memory cell while the override circuitry asserts the override configuration value onto the bitline;
wherein the bitline comprises a repeater circuit; and
wherein the control circuitry is further configured to disable the repeater circuit while the override circuitry asserts the override configuration value onto the bitline.

2. The IC device of claim 1, wherein the control circuitry is further configured to assert the wordline of the first memory cell while the override circuitry asserts the override configuration value onto the bitline to couple the bitline to the node of the configurable circuitry through the first memory cell.

3. The IC device of claim 1, wherein the control circuitry is further configured assert the wordline of the first memory cell while the override circuitry asserts the override configuration value onto the bitline to provide the override configuration value from the bitline to the node of the configurable circuitry through the first memory cell.

4. The IC device of claim 1, wherein the control circuitry is further configured assert the wordline of the first memory cell while the override circuitry asserts the override configuration value onto the bitline to force a state of the data node of the first memory cell to the override configuration value.

5. The IC device of claim 1, wherein:
the override circuitry comprises volatile memory circuitry; and
the control circuitry is further configured to store the override configuration value in the volatile memory circuitry and control the override circuitry to assert the override configuration value stored in the volatile memory circuitry to the bitline.

6. The IC device of claim 1, further comprising:
non-volatile storage circuitry;
wherein the control circuitry is further configured to retrieve an identifier of the first memory cell from the non-volatile storage circuitry, retrieve a configuration value assigned to the first memory cell based on the identifier, and configure the override circuitry to assert the configuration value assigned to the first memory cell as the override configuration value.

7. The IC device of claim 1, wherein:
the memory cells are arranged in columns of memory cells,
each column of memory cells is served by a respective set of wordlines;

the columns share the bitline;

the repeater circuit is positioned between adjacent blocks of the columns; and the repeater is configured as an open circuit when the override circuitry is in use to isolate a segment of the bitline that serves a block in which the first memory cell resides.

8. The IC device of claim 1, wherein:

the configurable circuitry comprises functional circuit blocks and interconnect circuitry distributed amongst the functional circuit blocks; and the memory cells of the configuration memory are distributed amongst the functional circuit blocks and the interconnect circuitry.

9. The IC device of claim 1, further comprising:

non-volatile memory; and test circuitry configured to identify the first memory cell as a faulty memory cell, determine that the faulty memory cell can be overridden, and store an identifier of the faulty memory cell in the non-volatile memory.

10. A method, comprising:

asserting an override configuration value on a bitline of memory cells of configuration memory of an integrated circuit (IC) device, wherein a data node of a first one of the memory cells is coupled to a node of configurable circuitry of the IC device;

asserting a wordline of the first memory cell while the override configuration value is asserted on the bitline; and disabling repeater circuitry of the bitline while asserting the wordline.

11. The method of claim 10, wherein the asserting the wordline comprises:

coupling the bitline to the node of the configurable circuitry through the first memory cell.

12. The method of claim 10, wherein the asserting the wordline comprises:

providing the override configuration value from the bitline to the node of the configurable circuitry through the first memory cell.

13. The method of claim 10, further comprising:

programming the memory cells with configuration bits;

asserting the override configuration value onto the bitline subsequent to the programming; and asserting the wordline of the first memory cell and disabling the repeater circuitry subsequent to the programming.

14. The method of claim 10, further comprising:

storing the override configuration value in volatile memory of the IC device;

wherein the asserting the override configuration value comprises controlling the volatile memory to assert the stored override configuration value to the bitline.

15. The method of claim 10, further comprising:

retrieving an identifier of the first memory cell from non-volatile storage circuitry of the IC device; and retrieving a configuration value assigned to the first memory cell based on the identifier;

wherein the asserting the override configuration value comprises asserting the configuration value assigned to the first memory cell on the bitline as the override configuration value.

16. The method of claim 15, further comprising:

storing the identifier of the first memory cell in the non-volatile storage circuitry based upon a determination that the first memory cell fails a read-back test and that the first memory cell can be overridden.

17. The method of claim 16, wherein the storing comprises:

storing the identifier of the first memory cell in the non-volatile storage circuitry based further upon determinations that no other memory cell within a block of memory cells served by the bitline fails the read-back test and that the first memory cell can be overridden.

18. The IC device of claim 1, wherein:

the override circuitry comprises a spare memory cell of the configuration memory.

19. An integrated circuit (IC) device, comprising:

configurable circuitry;

a bitline;

first and second blocks of configuration memory, each comprising configuration memory cells and an override memory cell, wherein, the configuration memory cells and the override memory cells comprise respective storage nodes and access circuits to couple the respective storage nodes to the bitline based on respective wordline controls, the storage node of one or more of the configuration memory cells is coupled to the configurable circuitry, and the bitline comprises a buffer circuit between the first and second blocks of configuration memory; and control circuitry configured to control the access circuits of the override memory cells to couple the storage node of one or more of the override memory cells to the bitline and to disable the buffer circuit.

20. The IC device of claim 19, wherein:

the override memory cells comprise reserved ones of the configuration memory cells.

* * * * *